(12) United States Patent
Viljanen

(10) Patent No.: US 7,271,671 B2
(45) Date of Patent: Sep. 18, 2007

(54) ARRANGING A CRYSTAL TO GENERATE AN OSCILLATING SIGNAL

(75) Inventor: Ari Viljanen, Tampere (FI)

(73) Assignee: Nokia Corporation, Espoo (FI)

( * ) Notice: Subject to any disclaimer, the term of this patent is extended or adjusted under 35 U.S.C. 154(b) by 164 days.

(21) Appl. No.: 11/140,505

(22) Filed: May 27, 2005

(65) Prior Publication Data

US 2005/0270112 A1 Dec. 8, 2005

(51) Int. Cl.
*H03B 5/32* (2006.01)
*H03B 25/00* (2006.01)

(52) U.S. Cl. .................. 331/158; 331/60; 331/116 R

(58) Field of Classification Search ............. 331/158, 331/60, 116 R, 163
See application file for complete search history.

(56) References Cited

U.S. PATENT DOCUMENTS

| | | | |
|---|---|---|---|
| 3,671,880 A * | 6/1972 | Kuiper et al. ............ 331/51 |
| 3,956,714 A | 5/1976 | Luscher .................. 331/116 R |
| 4,379,984 A * | 4/1983 | Muller .................... 318/254 |
| 6,734,747 B1 * | 5/2004 | Ishikawa et al. ............ 331/158 |
| 6,771,136 B1 * | 8/2004 | Reynolds ................... 331/74 |
| 2001/0020876 A1 | 9/2001 | Tsukagoshi et al. ........ 331/158 |
| 2001/0045869 A1 | 11/2001 | Nakamura ................ 331/158 |
| 2003/0025567 A1 | 2/2003 | Kubo et al. .............. 331/158 |

OTHER PUBLICATIONS

Hambley, Allan R., Electrical Engineering: Principles and Applications, Jul. 2001, Prentice-Hall, 2nd edition, p. 120.*
Eccles, M., "Applying Crystals", Electronics World (Incl. Wireless World) Reed Business Publishing, Sutton, Surrey, GB, vol. 100, No. 1701, Aug. 1, 1994, pp. 659-663.

* cited by examiner

*Primary Examiner*—Robert Pascal
*Assistant Examiner*—Ryan J Johnson
(74) *Attorney, Agent, or Firm*—Perman & Green, LLP

(57) ABSTRACT

A crystal is loaded with capacitance in such a way that it begins to oscillate at a desired frequency with a resonance circuit (2). Capacitive voltage division is carried out with a voltage divider to at least one terminal (3) of the crystal (1). From the voltage divider, the signal of the crystal (1) is supplied to a second circuit (7).

8 Claims, 2 Drawing Sheets

ARRANGING A CRYSTAL TO GENERATE AN OSCILLATING SIGNAL

CROSS-REFERENCE TO RELATED APPLICATIONS

This application claims priority from Finnish Patent Application No. 20045198, filed on May 31, 2004.

BACKGROUND OF THE INVENTION

The invention relates to a method for arranging a crystal to generate an oscillating signal for a circuit, in which method the crystal is loaded with capacitance in such a way that the crystal begins to oscillate at a desired frequency with a resonance circuit.

Further, the invention relates to an oscillating circuit comprising a crystal, and capacitors that load the crystal in such a way that the crystal oscillates at a desired frequency with a resonance circuit connected to the crystal.

Yet further, the invention relates to a mobile station comprising an oscillating circuit that is arranged to generate an oscillating signal required by the mobile station, whereby the oscillating circuit comprises a crystal, and capacitors that load the crystal in such a way that the crystal oscillates at a desired frequency with a resonance circuit connected to the crystal.

An oscillating signal for generating reference and clock frequencies is obtained by means of a crystal by loading the crystal capacitively. Seeing the correct capacitive load at its terminals, the crystal begins to oscillate at a desired frequency. A resonance circuit is connected in parallel with the crystal, whereby this resonance circuit is typically an integrated oscillating circuit. Thus, the crystal and the capacitors loading it are arranged outside the integrated circuit.

Particularly crystals in radio frequency use have typically no capacity to distribute the signal to several circuits. Further, the crystal is very sensitive to variation in the capacitive load, whereby the oscillating frequency of the crystal changes easily. At radio frequencies, the noise and jitter requirements of the oscillator are also extremely strict. Thus, a separate crystal is typically arranged for each circuit to generate an oscillating signal. The oscillating signal could be, in principle, taken not only from the resonance circuit connected in parallel with the crystal, but from a crystal terminal by means of a buffer, but the buffer causes impedance, which is seen at the crystal terminals. The change in the impedance caused by the buffer, in turn, changes the oscillating frequency of the crystal and, on the other hand, reduces the amplitude of the oscillation. In the worst case, the crystal load changes so much that the resonator circuit does not begin to oscillate at all.

U.S. Pat. No. 4,419,739 discloses a processor comprising several circuits, each of which has a local clock circuit of its own. Different clock circuits are controlled by a master clock, whereby the intention is to synchronize all circuits to the same frequency, which deviates very little from the frequency of the master clock. The solution is rather complex and becomes also rather expensive, because each circuit has a separate clock circuit. Further, synchronizing the clock circuits to the same frequency is fairly complex and difficult.

In publication US 2003/0 163 751, a clock signal is generated with an oscillator, and the intention is to transmit the clock signal to different destination points in such a way that there is as little signal delay and skew as possible. The solution presented is to use a low-loss transmission line together with a clock signal having a low rise rate. However, the system has a complex structure and thus the implementation on the whole is difficult, expensive and insecure.

BRIEF DESCRIPTION OF THE INVENTION

An object of the present invention is to provide a method with which a crystal is caused to generate an oscillating signal for two or more circuits, as well as a corresponding oscillating circuit and mobile station.

The method according to the invention is characterized by carrying out capacitive voltage division to at least one terminal of the crystal with a voltage divider, and supplying the oscillating signal of the crystal from the voltage divider to a second circuit.

Further, the oscillating circuit according to the invention is characterized in that at least two capacitors are connected in series at least one terminal of the crystal in such a way that the capacitors form a capacitive voltage divider and that a buffer is connected between the capacitors for supplying the oscillating signal of the crystal to a second circuit.

Yet further, the mobile station according to the invention is characterized in that at least two capacitors are connected in series at least one terminal of the crystal in such a way that the capacitors form a capacitive voltage divider and that a buffer is connected between the capacitors for supplying the oscillating signal of the crystal to a second circuit.

An essential idea of the invention is that the crystal is loaded with capacitance, whereby it begins to oscillate at a desired frequency. The crystal is connected to a resonance circuit to supply the oscillating frequency to the circuit. Capacitive voltage division is carried out to at least one crystal terminal, and from the voltage divider the crystal signal is supplied to a second circuit. Thus, supplying the oscillating signal also to the second circuit does not cause a very great change in the capacitive load seen by the crystal terminals. Thus, the oscillating frequency of the crystal does not, despite the increased load, change essentially and the signal amplitude does not become too low either. Thus, the oscillating signal can be supplied to at least two different circuits with one crystal. Thus, since one crystal can be used for two or more circuits, the overall solution can be implemented by using fewer crystals than before. This, in turn, results in less circuit-board area being used and the overall solution becoming also less expensive. Also, the crystal is typically a potential source of interference, so the solution according to the invention reduces generation of interference. On the whole, the solution is simple, easy to implement and reliable.

BRIEF DESCRIPTION OF THE FIGURES

The invention will now be described in greater detail with reference to the attached drawings, of which

DETAILED DESCRIPTION OF THE INVENTION

Figure 1:
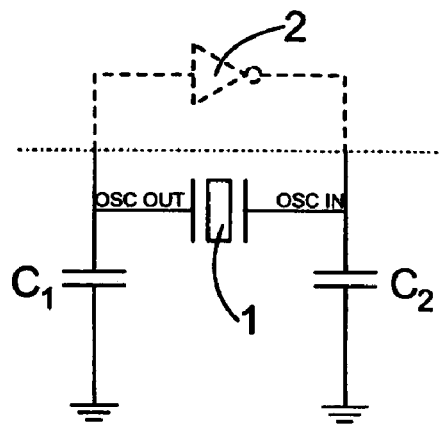
FIG. 1 shows a diagram of a prior art solution for generating an oscillating signal.

FIG. 1 shows a crystal 1. At the resonance frequency, the electric equivalent circuit of the crystal is inductance. Capacitors $C_1$ and $C_2$ are connected to the terminals of the crystal 1. When the capacitance of the capacitors $C_1$ and $C_2$ is selected to be correct, the crystal 1 sees the correct capacitance load at its terminals and begins to oscillate at a desired resonance frequency. In parallel with the crystal 1, a circuit 2 is connected, shown simplified and with a broken line in FIG. 1. The circuit 2 is preferably an integrated resonance circuit. Thus, the circuit 2 forms an oscillator together with the crystal 1 in such a way that the crystal 1 and the capacitors $C_1$ and $C_2$ connected to its terminals are left outside the integrated circuit.

In terms of typical numerical values, it can be presented that it is desirable that the crystal 1 oscillate at a frequency of 12 MHz, and that in such a case the crystal 1 wishes to see a capacitive load of 10 pF at its terminals. To fulfil this requirement, the magnitudes of the capacitors $C_1$ and $C_2$ are selected in such a way, for example, that both $C_1$ and $C_2$ have a magnitude of 20 pF. The order of magnitude of the resistance between the crystal terminal and the ground is in this case so small that it can be left unobserved.

Figure 2:
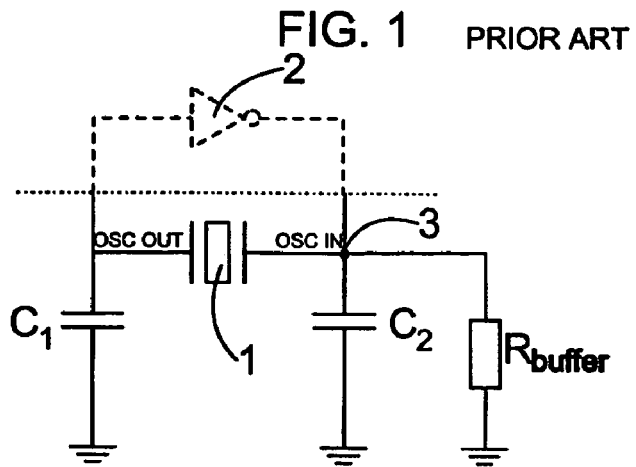
FIG. 2 shows a diagram of a second prior art solution for generating an oscillating signal.

FIG. 2 shows a solution where it is attempted to generate an oscillating signal also for a second circuit with the crystal 1. The oscillating signal can be obtained from a crystal terminal 3. A buffer is connected to the crystal terminal 3 for propagating the oscillating signal to the second circuit. For the sake of clarity, FIG. 2 shows neither the structure of the buffer in more detail nor the circuit to which the oscillating signal is propagated with the buffer, but the buffer and the second circuit are simply indicated by impedance $R_{buffer}$ caused by the buffer.

In the case of FIG. 2, capacitance $C_{3s}$ between the crystal terminal 3 and the ground can be calculated with formula 1, and resistance $R_{3s}$ between the crystal terminal 3 and the ground can be calculated with formula 2.

$$C_{3s} = C_2 \left[ 1 + \frac{1}{(\omega C_2 R_{buffer})^2} \right] \quad (1)$$

$$R_{3s} = \frac{R_{buffer}}{1 + \omega C_2 R_{buffer}} \quad (2)$$

whereby $\omega = 2\pi f$ and
f=frequency.

Formulae 1 and 2 are thus used to convert the connection in parallel of the capacitor $C_2$ and the resistance $R_{buffer}$, shown in FIG. 2, with conversion formulae into equivalent connection in series. $C_{3s}$ and $R_{3s}$ thus express, as seen from the crystal terminal, the capacitor and the resistance connected in series in such a way that the connection in series is equivalent to real connection.

If the value of the capacitor $C_2$ is 20 pF, the impedance $R_{buffer}$ caused by the buffer is 25 kΩ and the frequency f=12 MHz, then the capacitance $C_{3s}$ between the crystal terminal 3 and the ground=20.6 pF. The resistance $R_{3s}$ between the crystal terminal 3 and the ground is, in turn, 676 Ω. Against the ground the crystal 1 thus sees, instead of an ideal capacitor of 20 pF, a capacitor of 20.6 pF in series with a resistance of 676 Ω. The capacitance $C_1$ seen by the crystal 1 can, in turn, be calculated by means of formula 3.

$$C_l = \frac{C_1 C_{35}}{C_1 + C_{35}} \quad (3)$$

Thus, in the case of FIG. 2, the capacitive load seen by the crystal 1 is $C_1$=10,15 pF. This causes the vibration frequency of the crystal 1 to change from what it is in the case of FIG. 1. Converting the frequency of the crystal 1 may be excessive, due to which the devices utilizing the oscillating signal do not function in a desired manner. On the other hand, the resistive load of the buffer causes noise and reduces the amplitude of the oscillation. In the worst case, it may be the case that the crystal 1 does not begin to oscillate at all.

Figure 3:
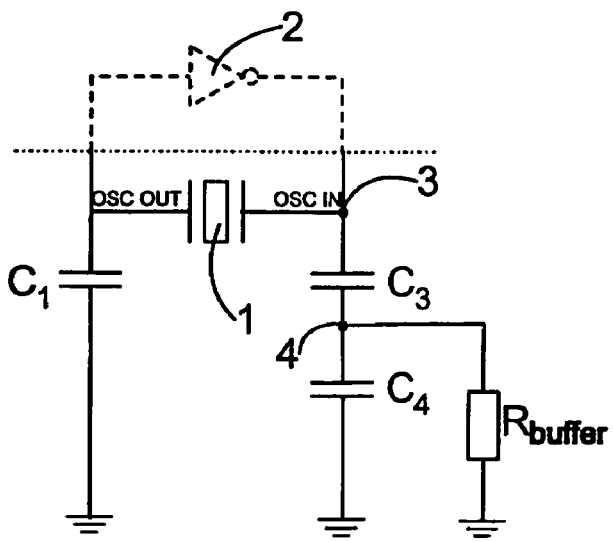
FIG. 3 shows a diagram of a third solution for generating an oscillating signal.

FIG. 3 shows a solution deviating from the solution of FIG. 2 in such a way that the capacitor $C_2$ of FIG. 2 has been replaced by two capacitors $C_3$ and $C_4$ connected in series. Thus, in this case, the capacitor $C_2$ of 20 pF, for example, is replaced by two capacitors $C_3$ and $C_4$ connected in series, the magnitude of each being 40 pF, in other words 2 $C_2=C_3=C_4$. Thus, a capacitive voltage divider is formed at the terminal 3 of the crystal by means of two capacitors. The buffer is connected to the voltage divider at point 4 between the capacitors $C_3$ and $C_4$.

If the values of different components are of a corresponding type also in the solution of FIG. 3, i.e. if, for example, the impedance $R_{buffer}$ caused by the buffer is 25 kΩ, the capacitance $C_{4s}$ between point 4 and the ground can be calculated in accordance with formula 4.

$$C_{4s} = C_3 \left[ 1 + \frac{1}{(\omega C_3 R_{buffer})^2} \right] \quad (4)$$

In this case, therefore, the capacitance $C_{4s}$ between point 4 and the ground=40,3 pF. The total capacitance $C_{3s}$ between the terminal 3 and the ground is, in turn, 20.07 pF. The capacitive load seen by the crystal 3 is, in turn, 10.02 pF. Thus, the capacitive load seen by the crystal 1 is thus nearly equal to the capacitive load seen by the crystal 1 in the case of FIG. 1. Therefore, in the case of FIG. 3 the frequency of the crystal 1 does not change essentially, although in addition to the circuit 2, also a buffer is connected to the crystal 1.

The resistance $R_{4s}$ between point 4 and the ground can be calculated by means of formula 5.

$$R_{4s} = \frac{R_{buffer}}{1 + (\omega C_4 R_{buffer})} \quad (5)$$

As with formulae 1 and 2, the conversion into equivalent connection in series is thus calculated by means of formulae 4 and 5.

Thus, $R_{4s}$=172 Ω. The total resistance $R_{3s}$ between the terminal 3 of the crystal and the ground is of the same order of magnitude, because the capacitor $C_3$ has little effect on the magnitude of the resistance. Thus, the load caused by the buffer, affecting the amplitude of the oscillation, is in the case of FIG. 3 significantly smaller than in FIG. 2.

In the above-mentioned example, it is assumed that the buffer causes a fully resistive load. Depending on the buffer topology, the load caused by it may naturally also be capacitive. Depending on the impedance caused by the buffer, however, it is possible in all cases to calculate the change in the impedance, seen by the crystal terminals, by applying the above-described principles. However, it can be seen from the solution of FIG. 3 that the effect of the buffer impedance on the impedance seen by the crystal terminals is not at all as great as in the case of FIG. 2. The impedance state of an active buffer may vary. When dead, for example, the buffer impedance may be different than when active. However, as noted, this change in the impedance does not significantly affect the impedance seen by the crystal terminals.

Capacitances $C_3$ and $C_4$ do not necessarily have to be equal. By the mutual magnitudes of the capacitances $C_3$ and $C_4$ it is possible to control how much the buffer impedance is to affect the impedance seen by the crystal terminals. If the value of the capacitor $C_4$ is changed to be higher and the value of the capacitor $C_3$ is changed to be lower, the oscillation amplitude to the buffer is reduced, but the crystal 1 sees a smaller change in the capacitance. If, on the other hand, the amplitude of the oscillation to be fed to the buffer must be relatively high, the value of the capacitor $C_3$ is selected to be higher and the value of the capacitor $C_4$ to be lower if this will not be too detrimental because of the change in the crystal frequency. Thus, also the crystal frequency can be controlled in a desired manner by means of the capacitors $C_3$ and $C_4$.

Owing to the capacitive voltage divider, the voltage at point 4 may vary without being detrimental to the crystal 1. Thus, biasing the buffer voltage can be performed in a desired manner, which is not possible in the case of the embodiment of FIG. 2.

Figure 4:
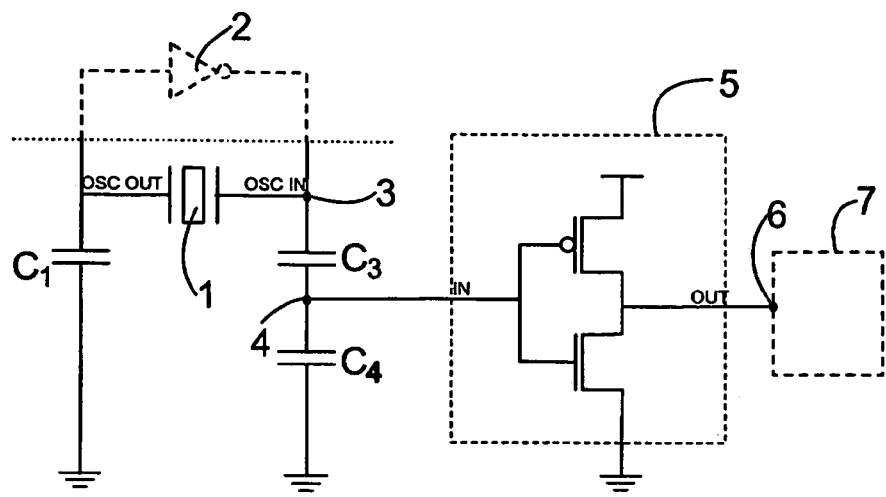
FIG. 4 shows an embodiment of the solution according to FIG. 3 in more detail.

The solution of FIG. 4 corresponds to that of FIG. 3, but FIG. 4 shows the buffer 5 in more detail. For illustrative purposes, the buffer 5 in FIG. 4 is surrounded by a broken line. As regards the topology, the buffer 5 may be an MOS inverter shown in FIG. 4, or any other buffer known per se. It depends on the topology of the buffer 5 how it affects the impedance seen by the crystal terminals. For instance, an MOS buffer would increase the capacitive load, whereas the bipolar stage would also increase the resistive load.

FIG. 4 further shows an outlet pin 6, from which the reference frequency can be supplied to another integrated circuit 7, for example.

Figure 5:
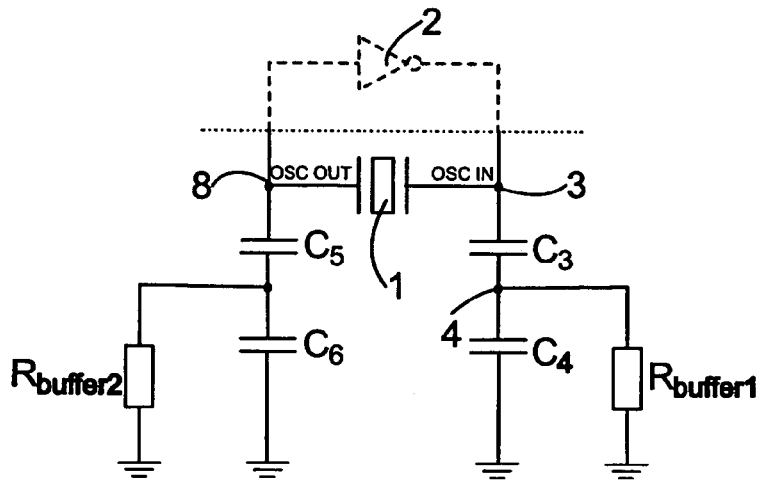
FIG. 5 shows a diagram of a fourth solution for generating an oscillating signal.

FIG. 5 shows an embodiment where a voltage divider is formed at the first terminal 3 of the crystal 1 in a way corresponding to the embodiment of FIG. 3. In the embodiment of FIG. 5, also the second terminal 8 of the crystal is provided with a capacitive voltage divider in a corresponding manner. With the solution of FIG. 5, the oscillating frequency can be fed to three different circuits. Naturally, a prerequisite for this is that the crystal 1 fulfils the requirements of all of the three different circuits. Capacitors $C_5$ and $C_6$ may be equal to the capacitors $C_3$ and $C_4$, but their values may naturally also be different. Likewise, the buffers may be similar or different, whereby also the impedances $R_{buffer1}$ and $R_{buffer2}$ are correspondingly either similar or different.

Figure 6:
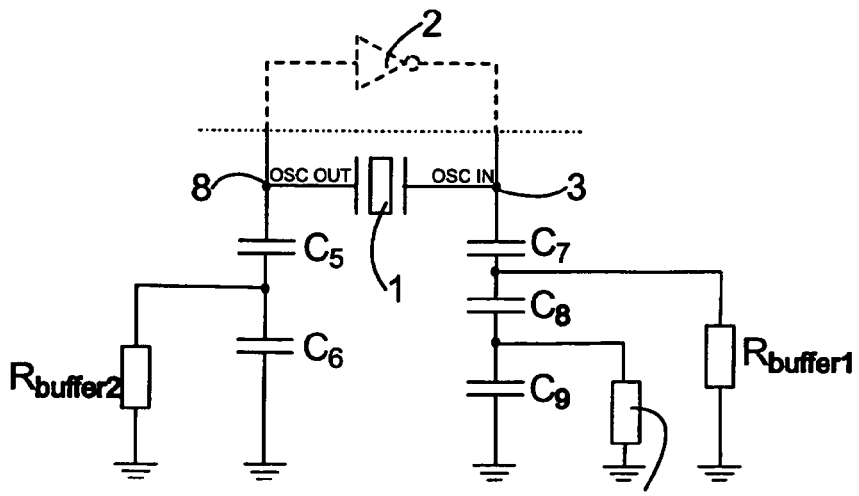
FIG. 6 shows a diagram of a fifth solution for generating an oscillating signal.

FIG. 6 shows a solution where the voltage division of the first terminal 3 of the crystal is provided by using three capacitors $C_7$, $C_8$ and $C_9$. This solution allows two buffers $R_{buffer1}$ and $R_{buffer2}$ to be arranged in connection with the first terminal 3 of the crystal. In connection with the second terminal 8 of the crystal, there is voltage division similar to that in FIG. 5, whereby one buffer $R_{buffer2}$ is arranged in connection with the second terminal 8 of the crystal. Thus, in the case of FIG. 6, the oscillating signal can be supplied to four different circuits. If the requirements of the circuits are suitable for the signal and if the impedance change caused by the circuit buffers, as seen from the terminals of the crystal 1, is not too great, a solution of this type allows the oscillating signal to be supplied to even four or more circuits.

The solutions presented are particularly suitable for use with mobile phones or other mobile stations.

The drawings and the related description are only intended to illustrate the idea of the invention. The details of the invention may vary within the scope of the claims. Thus, the capacitive voltage division may be carried out in ways other than those shown in the figures.

The invention claimed is:

1. A method for arranging a crystal to generate an oscillating signal for a circuit, the method comprising loading the crystal with capacitance in such a way that the crystal begins to oscillate at a desired frequency with a resonance circuit, carrying out capacitive voltage division to both terminals of the crystal with a first and a second voltage divider, and supplying the oscillating signal of the crystal from the first voltage divider to a second circuit and from the second voltage divider to a third circuit.

2. A method according to claim 1, comprising supplying the oscillating signal of the crystal from the voltage dividers to several circuits.

3. An oscillating circuit comprising a crystal, and capacitors that load the crystal in such a way that the crystal oscillates at a desired frequency with a resonance circuit connected to the crystal, wherein at least two capacitors are connected in series at both terminals of the crystal in such a way that the capacitors form a capacitive voltage divider and that a first buffer is connected between the capacitors at the first terminal for supplying the oscillating signal of the crystal to a second circuit and a second buffer is connected between the capacitors at the second terminal for sunolying the oscillating signal of the crystal to a third circuit.

4. An oscillating circuit according to claim 3, wherein at least three capacitors are connected in series at least one terminal of the crystal, whereby the oscillating signal of the crystal is suppliable from the at least one terminal of the crystal to at least two different circuits.

5. An oscillating circuit according to claim 3, wherein at least two capacitors of substantially equal magnitude are connected to the at least one terminal of the crystal.

6. A mobile station comprising an oscillating circuit that is arranged to generate an oscillating signal required by the mobile station, whereby the oscillating circuit comprises a crystal, and capacitors that load the crystal in such a way that the crystal oscillates at a desired frequency with a resonance circuit connected to the crystal, wherein at least two capacitors are connected in series at both terminals of the crystal in such a way that the capacitors form a capacitive voltage divider and a first buffer is connected between the capacitors at the first terminal for supplying the oscillating signal of the crystal to a second circuit and a second buffer is connected between the canacitors at the second terminal for supplying the oscillating signal of the crystal to a third circuit.

7. A mobile station according to claim 6, wherein at least three capacitors are connected in series at least one terminal of the crystal, whereby the oscillating signal of the crystal is suppliable from the at least one terminal of the crystal to at least two different circuits.

8. A mobile station according to claim 6, wherein at least two capacitors of substantially equal magnitude are connected to at least one terminal of the crystal.

* * * * *